(12) United States Patent
Koyama

(10) Patent No.: US 10,367,459 B2
(45) Date of Patent: Jul. 30, 2019

(54) CLASS-D AMPLIFIER CIRCUIT

(71) Applicant: ROHM CO., LTD., Ukyo-ku, Kyoto (JP)

(72) Inventor: Yasuyuki Koyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/705,868

(22) Filed: Sep. 15, 2017

(65) Prior Publication Data

US 2018/0076781 A1    Mar. 15, 2018

(30) Foreign Application Priority Data

Sep. 15, 2016  (JP) ................................. 2016-180241

(51) Int. Cl.
*H03F 3/217* (2006.01)
*H03F 1/52* (2006.01)
*H03F 3/187* (2006.01)

(52) U.S. Cl.
CPC .......... *H03F 3/2173* (2013.01); *H03F 1/523* (2013.01); *H03F 3/187* (2013.01); *H03F 3/2171* (2013.01); *H03F 2200/03* (2013.01); *H03F 2200/171* (2013.01); *H03F 2200/351* (2013.01); *H03F 2200/426* (2013.01); *H03F 2200/462* (2013.01)

(58) Field of Classification Search
CPC ......... H03F 2200/426; H03F 2200/441; H03F 1/52; H03F 1/523; H03F 3/72; H03F 2200/444; H03F 2200/78; H03F 1/526; H03F 1/544; H03F 1/548; H03F 3/30; H03F 2200/447; H03F 3/217; H03G 3/3042
USPC .......................... 330/207 A, 207 P, 298, 251
See application file for complete search history.

(56) References Cited

U.S. PATENT DOCUMENTS

| | | | | |
|---|---|---|---|---|
| 7,554,409 B1* | 6/2009 | Zhang | ..................... | H03F 1/523 330/10 |
| 7,570,118 B1* | 8/2009 | Gaboriau | ................ | H03F 1/523 330/10 |
| 7,649,414 B2* | 1/2010 | Kaya | ....................... | H03F 3/217 330/251 |
| 7,705,673 B2* | 4/2010 | Teng | ....................... | H03F 1/523 330/207 P |

(Continued)

*Primary Examiner* — Khanh V Nguyen
(74) *Attorney, Agent, or Firm* — Cantor Colburn LLP

(57) ABSTRACT

A bridge output stage is coupled to an electroacoustic conversion element via an inductor L. Driving circuits drive the output stage according to pulse signals $S_{2H}$ and $S_{2L}$ that correspond to an audio signal $S_1$. An overcurrent detection circuit asserts an overcurrent detection signal $S_{3L}$ (i) when a current $I_{ML}$ that flows through a transistor $M_L$ to be monitored that forms the output stage is continuously larger than a first threshold value for a first period of time or (ii) when the current $I_{ML}$ that flows through the transistor $M_L$ to be monitored is larger than a second threshold value that is higher than the first threshold value after a predetermined second period of time elapses after the transistor $M_L$ to be monitored turns on.

12 Claims, 9 Drawing Sheets

(56) References Cited

U.S. PATENT DOCUMENTS

| | | | |
|---|---|---|---|
| 7,706,545 B2* | 4/2010 | Kost | H03F 1/523 381/106 |
| 2008/0043391 A1* | 2/2008 | Wong | H03F 1/52 361/59 |
| 2013/0049779 A1* | 2/2013 | Berkhout | G01R 31/275 324/750.01 |

* cited by examiner

CLASS-D AMPLIFIER CIRCUIT

CROSS REFERENCE TO RELATED APPLICATIONS

The present invention claims priority under 35 U.S.C. § 119 to Japanese Patent Application No. 2016-180241 filed on Sep. 15, 2016, the entire content of which are incorporated herein by reference.

BACKGROUND OF THE INVENTION

1. Field of the Invention

The present invention relates to a Class-D amplifier circuit that drives a speaker or headphones.

2. Description of the Related Art

A Class-D amplifier circuit is employed in order to amplify a weak audio signal so as to drive an electroacoustic conversion element such as a speaker, headphones, or the like. FIG. 1 is a circuit diagram showing an output stage of a Class-D amplifier circuit. The Class-D amplifier circuit 100R includes a half-bridge output stage 102, driving circuits 104H and 104L, and a pulse width modulator 106.

The output stage 102 includes a high-side transistor $M_H$ arranged between a power supply pin VCC and an output pin OUT and a low-side transistor $M_L$ arranged between the output pin OUT and a ground pin GND. The OUT pin is coupled to an electroacoustic conversion element 202 via an LC filter 204 and an output coupling capacitor 205.

The pulse width modulator 106 receives an analog or otherwise digital audio signal, and generates a PWM signal having a duty ratio (pulse width) that changes according to the audio signal. The driving circuits 104H and 104L drive the high-side transistor $M_H$ and the low-side transistor $M_L$, respectively, according to the PWM signal generated by the pulse width modulator 106.

If a large current flows through the output stage 102, such an arrangement has the potential to involve degraded reliability of the transistors $M_H$ and $M_L$ which are circuit elements of the output stage 102. In order to solve such a problem, the output stage 102 of the Class-D amplifier circuit 100R is provided with overcurrent protection circuits 120H and 120L.

The overcurrent protection circuit 120H compares a current $I_{MH}$ that flows through the high-side transistor $M_H$ with an overcurrent detection threshold value $I_{OCP}$. When the current $I_{MH}$ that flows through the high-side transistor $M_H$ exceeds the threshold value $I_{OCP}$, judgment is made that an overcurrent state has occurred. In this case, the high-side transistor $M_H$ is forcibly turned off. Similarly, when a current $I_{ML}$ that flows through the low-side transistor $M_L$ exceeds the threshold value $I_{OCP}$, the overcurrent protection circuit 120L judges that an overcurrent state has occurred. In such an overcurrent state, the low-side transistor $M_L$ is forcibly turned off The overcurrent protection circuit 120H (120L) is vulnerable to the effects of switching noise that occurs in the output stage 102. In order to solve such a problem, a predetermined judgment time $\tau_1$ is defined. When a state in which $I_{MH} > I_{OCP}$ continues for only a period that is shorter than the judgment time $\tau_1$, such a state is masked. Only when a state in which $I_{MH} > I_{OCP}$ continues for a period that is longer than the judgment time $\tau_1$, judgment is made that overcurrent protection is to be performed. This suppresses the effects of noise.

FIGS. 2A and 2B are waveform diagrams each showing the overcurrent protection operation. First, description will be made with reference to FIG. 2A regarding an ordinary overcurrent protection operation. For ease of understanding, description will be made directing attention to the inductor L of the LC filter 204 that functions as a load of the Class-D amplifier circuit 100R. Typically, the following expression (1) holds true between the current $I_{OUT}$ that flows through an inductor and a voltage v across the inductor.

$$I_{OUT} = 1/L \times \int v \, dt \quad (1)$$

Accordingly, assuming that the voltage v is constant, the output current $I_{OUT}$ increases with a constant slope according to the passage of time. With the half-bridge Class-D amplifier shown in FIG. 1, when the high-side transistor $M_H$ is turned on, the following relation holds true. That is to say, v is approximately equal to $V_{CC}$ (which is approximation assuming that the voltage across the electroacoustic conversion element 202 is zero). Thus, the following expression (2) holds true.

$$I_{OUT} = V_{CC}/L \times t \quad (2)$$

In FIG. 2A, in a case in which the output current $I_{OUT}$ becomes larger than the threshold value $I_{OCP}$ at the time point $t_0$, after the judgment time $\tau_1$ has elapsed, i.e., at the time point $t_1$, the overcurrent protection is enabled (OCP is set to the high level). In the overcurrent protection state, the high-side transistor $M_H$ is forcibly turned off, and accordingly, the output current $I_{OUT}$ is blocked. In the judgment time $\tau_1$, the output current $I_{OUT}$ rises as represented by $\Delta I = V_{CC}/L \times \tau_1$.

As a result of investigating the Class-D amplifier circuit 100R shown in FIG. 1, the present inventor has come to recognize the following problem.

In a case in which a DC (bias) current is applied to an inductor, magnetic saturation occurs, which leads to a reduction in the inductance value. This is known as the DC superposition characteristics of an inductor. FIG. 3 is a diagram for describing the DC superposition characteristics of the inductor. Specifically, in a range in which the DC current is smaller than an allowable current $I_{DC\_MAX}$, the inductance value exhibits a substantially constant value. When the DC current exceeds the allowable current $I_{DC\_MAX}$, the inductance value suddenly falls.

FIG. 2B shows the operation when a DC current that flows through the inductor L of the LC filter 204 becomes larger than the allowable current $I_{DC\_MAX}$. When magnetic saturation occurs, the inductance value L falls (the inductance value in this state will be represented by L'). In this case, the output current $I_{OUT}$ represented by Expression (2) has a steep slope.

In a case in which the output current $I_{OUT}$ exceeds the threshold value $I_{OCP}$ at the time point $t_0$, after the judgment time $\tau_1$ elapses in this state, i.e., at the time point $t_1$, the overcurrent protection is enabled. However, in the judgment time $\tau_1$, the output current $I_{OUT}$ rises as represented by $\Delta I = V_{CC}/L' \times \tau_1$. Accordingly, such an arrangement has the potential to allow deviation of the output current $I_{OUT}$ at the time point $t_1$ from an assurance range in which the reliability of the circuit elements can be ensured, to a damage range represented by the hatched area.

It should be noted that similar problems can occur in Class-D amplifiers employing the BTL (Bridged Transformerless) method.

SUMMARY OF THE INVENTION

The present invention has been made in order to solve such a problem. Accordingly, it is an exemplary purpose of an embodiment of the present invention to provide overcurrent protection giving consideration to the DC superposition characteristics of an inductor.

An embodiment of the present invention relates to a Class-D amplifier circuit. The Class-D amplifier circuit comprises: a bridge output stage coupled to an electroacoustic conversion element via an inductor; a driving circuit structured to drive the output stage according to a pulse signal that corresponds to an audio signal; and an overcurrent detection circuit structured to assert an overcurrent detection signal (i) when a current that flows through a transistor to be monitored that forms the output stage exceeds a first threshold value for a predetermined first period of time, or (ii) when a current that flows through the transistor to be monitored exceeds a second threshold value that is higher than the first threshold value after a predetermined second period of time elapses after the transistor to be monitored turns on.

In a range in which the DC current component that flows through an inductor is smaller than an allowable current, an overcurrent state can be detected based on the first threshold value. When the DC current component that flows through the inductor exceeds the allowable current, and accordingly, when the inductance value of the inductor falls due to magnetic saturation, the current that flows through the transistor reaches the second threshold value. In this case, an overcurrent detection signal is asserted with a detection delay that is shorter than the first period of time. This arrangement is capable of detecting an overcurrent state before the current that flows through the transistor excessively rises.

Such an arrangement is vulnerable to the effects of noise immediately after the transistor of the output stage turns on. On the other hand, the DC current component that flows through the inductor exceeds the allowable current after time elapses to a certain degree after the transistor of the output stage is turned on. Accordingly, in many cases, the DC current component does not exceed the allowable current immediately after the transistor of the output stage is turned on. Thus, by enabling the overcurrent detection based on the second threshold value after a predetermined second period of time elapses after a transistor to be monitored is turned on, which is employed as a condition for the overcurrent detection based on the second threshold value $I_{OCP2}$, such an arrangement is capable of preventing false detection of the overcurrent state due to noise.

Also, the transistor to be monitored may be turned off according to an assertion of the overcurrent detection signal. This allows cycle-by-cycle overcurrent detection.

Also, when a predetermined number of cycles of assertions of the overcurrent detection signal consecutively occur, switching of the output stage may be suspended. In a case in which a magnetic saturation state has occurred, such an arrangement consecutively asserts the overcurrent detection signal. Accordingly, in this case, by suspending the switching operation of the output stage, this is capable of providing improved safety protection of a circuit.

Also, the overcurrent detection circuit may comprise: a first comparator structured to compare a current detection signal that corresponds to a current that flows through the transistor to be monitored with a first threshold voltage that corresponds to the first threshold value, and to generate a first comparison signal indicating a comparison result; a second comparator structured to compare the current detection signal with a second threshold voltage that corresponds to the second threshold value, and to generate a second comparison signal indicating a comparison result; and a judgment circuit structured to generate the overcurrent detection signal based on the first comparison signal and the second comparison signal.

Also, the current detection signal may correspond to a voltage drop across the transistor to be monitored. This is capable of detecting a current with low power loss.

Also, a high-side transistor and a low-side transistor may both be set to be the transistor to be monitored.

Also, the output stage may be configured as a full-bridge circuit.

Also, the Class-D amplifier circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

By monolithically integrating the circuit on a single chip, such an arrangement allows the circuit area to be reduced, and allows the circuit elements to have uniform characteristics.

Another embodiment of the present invention relates to an audio playback device. The audio playback device comprises: an electroacoustic conversion element; any one of the aforementioned Class-D amplifier circuits; and a filter circuit comprising an inductor arranged between the Class-D amplifier circuit and the electroacoustic conversion element.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" also includes a state in which the member A is indirectly coupled to the member B via another member that does not affect the electric connection between them, or that does not damage the functions of the connection between them, in addition to a state in which they are physically and directly coupled.

Similarly, the state represented by the phrase "the member C is provided between the member A and the member B" also includes a state in which the member A is indirectly coupled to the member C, or the member B is indirectly coupled to the member C via another member that does not affect the electric connection between them, or that does not damage the functions of the connection between them, in addition to a state in which they are directly coupled.

Figure 1:
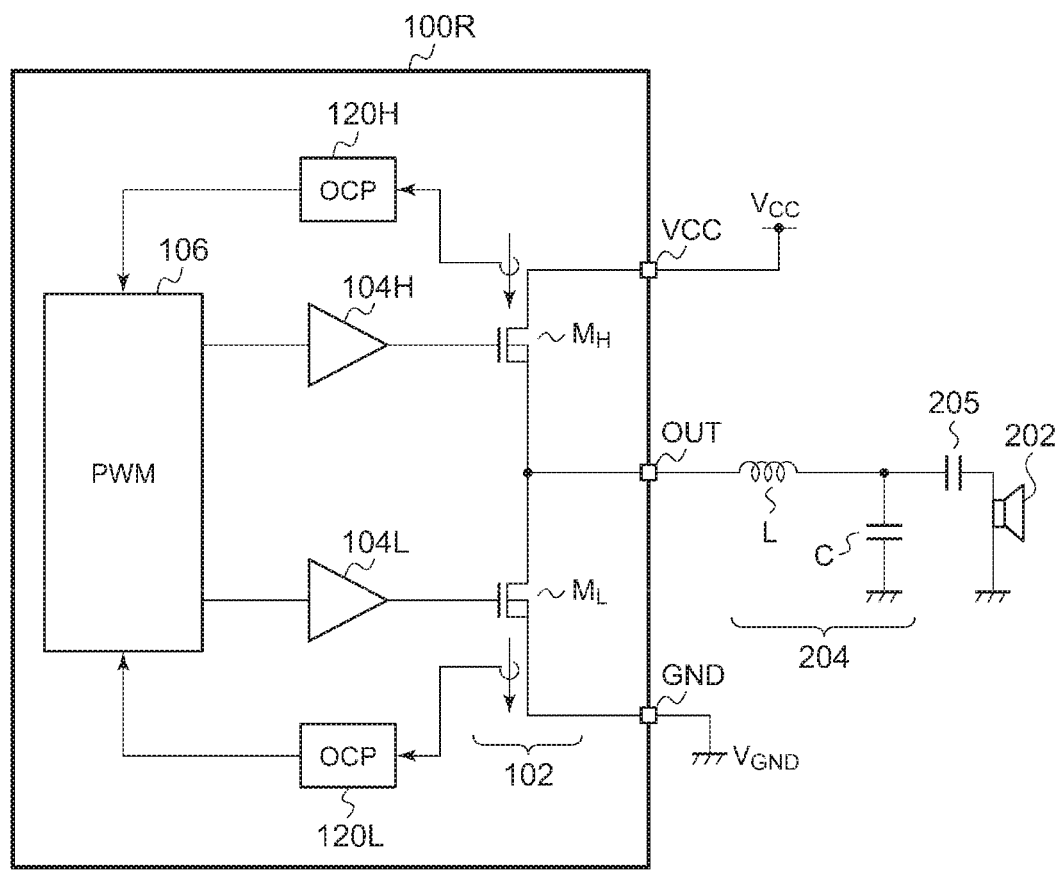
FIG. 1 is a circuit diagram showing an output stage of a Class-D amplifier circuit.
Figure 2A:
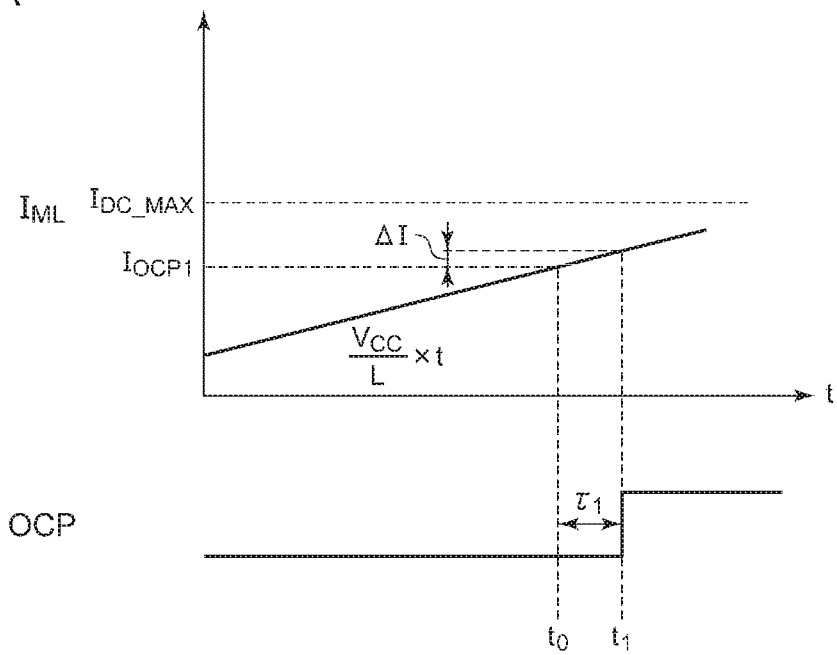
FIGS. 2A and 2B are waveform diagrams each showing an overcurrent protection operation.
Figure 2B:
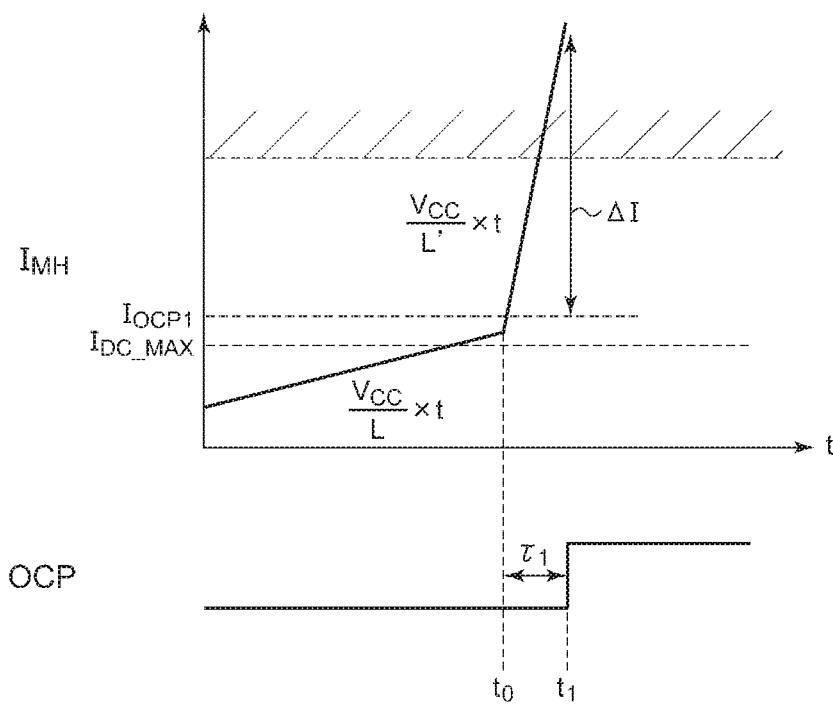
Figure 3:
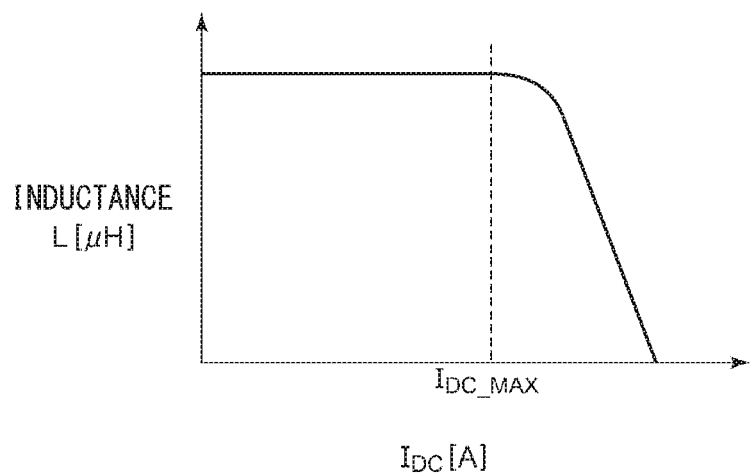
FIG. 3 is a diagram for describing DC superimposition characteristics of an inductor.
Figure 4:
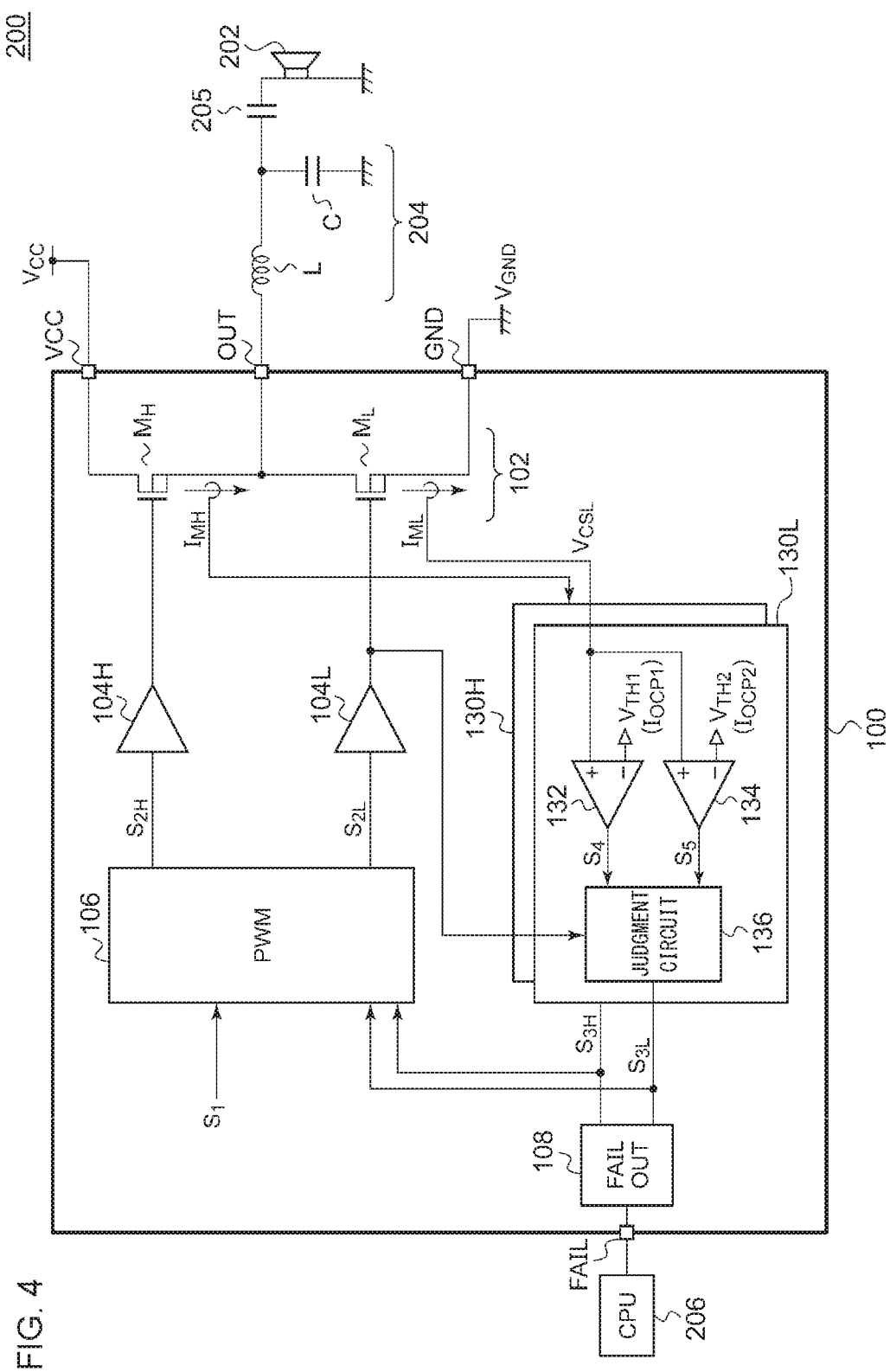
FIG. 4 is a block diagram showing an audio output device including a Class-D amplifier circuit according to an embodiment.

FIG. 4 is a block diagram showing an audio output device 200 including a Class-D amplifier circuit 100 according to an embodiment. As with the circuit configuration shown in FIG. 1, the audio output device 200 includes an electroacoustic conversion element 202, an LC filter 204, an output coupling capacitor 205, and a Class-D amplifier circuit 100.

The Class-D amplifier circuit 100 includes an output stage 102, driving circuits 104H and 104L, a pulse width modulator 106, and overcurrent detection circuits 130H and 130L, which are integrated on a single semiconductor substrate in the form of a function IC.

The half-bridge output stage 102 is coupled to the electroacoustic conversion element 202 via an inductor L of the LC filter 204 and the output coupling capacitor 205. The pulse width modulator 106 receives an audio signal $S_1$, and generates pulse-width modulated pulse signals $S_{2H}$ and $S_{2L}$. The driving circuits 104H and 104L drive a high-side transistor $M_H$ and a low-side transistor $M_L$ of the output stage 102 according to the pulse signals $S_{2H}$ and $S_{2L}$, respectively. It should be noted that the high-side transistor $M_H$ and the low-side transistor $M_L$ may each be a discrete element external to the Class-D amplifier circuit 100. Description will be made in this embodiment regarding an arrangement in which the high-side transistor $M_H$ is configured as an N-channel MOSFET, and an unshown bootstrap circuit is coupled to the driving circuit 104H.

During a period in which the high-side transistor $M_H$ is turned on and the low-side transistor $M_L$ is turned off, a voltage occurs at the OUT pin which is close to the input voltage $V_{CC}$ supplied to the power supply pin VCC. On the other hand, during a period in which the high-side transistor $M_H$ is turned off and the low-side transistor $M_L$ is turned on, a voltage occurs at the OUT pin which is close to the ground voltage $V_{GND}$ supplied to the GND pin. A pulse signal $V_{OUT}$ is generated at the OUT pin with a duty ratio that changes according to the audio signal $S_1$. The pulse signal $V_{OUT}$ is smoothed by the LC filter 204, and the audio signal $S_1$ is played back by means of the electroacoustic conversion element 202.

The overcurrent detection circuits 130H and 130L are configured to monitor the high-side transistor $M_H$ and the low-side transistor $M_L$, respectively, and are each configured in the same fashion with respect to function. Here, description will be made regarding the configuration and the operation of the overcurrent detection circuit 130L.

With the overcurrent detection circuit 130L, (i) when a state in which the current $I_{ML}$ that flows through the transistor $M_L$ to be monitored which forms the output stage 102 is larger than the first threshold $I_{OCP1}$ has continued for a predetermined first period of time (which will also be referred to as the "judgment time") $\tau_1$, the overcurrent detection circuit 130L asserts (sets to the high level, for example) an overcurrent detection signal $S_{3L}$. This will be referred to as the "first condition".

Furthermore, with the overcurrent detection circuit 130L, (ii) when the current $I_{ML}$ that flows through the transistor $M_L$ to be monitored exceeds a second threshold value $I_{OCP2}$ that is higher than the first threshold value $I_{OCP1}$ after a predetermined second period of time (which will be referred to as the "mask time") $\tau_2$ after the transistor $M_L$ to be monitored is turned on, the overcurrent detection circuit 130L asserts an overcurrent detection signal $S_{3L}$. This will be referred to as the "second condition". In the second condition, a detection delay (or judgment time) τ3 from the time point at which the current $I_{ML}$ exceeds the second threshold value $I_{OCP2}$ up to the time point at which the overcurrent detection signal $S_{3L}$ is asserted is sufficiently shorter than the judgment time $\tau_1$ designed in the first condition. The turn-on event of the transistor $M_L$ to be monitored can be detected based on the gate signal of the transistor $M_L$. However, the present invention is not restricted to such an arrangement. Also, the turn-on event may be detected based on the pulse signal $S_{2L}$ or the voltage $V_{OUT}$ at the OUT pin. Also, the turn-on event may be detected based on an internal signal of the pulse width modulator 106.

For example, the overcurrent detection circuit 130L includes a first comparator 132, a second comparator 134, and a judgment circuit 136. The first comparator 132 compares a current detection signal $V_{CSL}$ that corresponds to the current $I_{ML}$ that flows through the transistor $M_L$ to be monitored with a first threshold voltage $V_{TH1}$ that corresponds to the first threshold value $I_{OCP1}$, and generates a first comparison signal $S_4$ that indicates a comparison result. For example, when $V_{CSL}>V_{TH1}$, i.e., when $I_{ML}>I_{OCP1}$, the first comparison signal $S_4$ is set to the high level. Conversely, when $V_{CSL}<V_{TH1}$, i.e., when $I_{ML}<I_{OCP1}$, the first comparison signal $S_4$ is set to the low level.

The second comparator 134 compares the current detection signal $V_{CSL}$ that corresponds to the current $I_{ML}$ that flows through the transistor $M_L$ to be monitored with a second threshold voltage $V_{TH2}$ that corresponds to the second threshold value $I_{OCP2}$, and generates a second comparison signal $S_5$ that indicates a comparison result. For example, when $V_{CSL}>V_{TH2}$, i.e., when $I_{ML}>I_{OCP2}$, the second comparison signal $S_5$ is set to the high level. Conversely, when $V_{CSL}<V_{TH2}$, i.e., when $I_{ML}<I_{OCP2}$, the second comparison signal $S_5$ is set to the low level.

The judgment circuit 136 generates an overcurrent detection signal $S_{3L}$ based on the first comparison signal $S_4$ and the second comparison signal $S_5$. When the first comparison signal $S_4$ remains at the high level for the first period of time $\tau_1$, or when the second comparison signal $S_5$ transits to the high level after the second period of time $\tau_2$ elapses after the transistor $M_L$ is turned on, the judgment circuit 136 asserts the overcurrent detection signal $S_{3L}$.

The overcurrent detection circuit 130H monitors the current $I_{MH}$ that flows through the high-side transistor $M_H$. When an overcurrent state is detected, the overcurrent detection signal $S_{3H}$ is asserted.

The overcurrent detection signals $S_{3H}$ and $S_{3L}$ can be employed for overcurrent protection. For example, when the overcurrent detection signal $S_{3H}$ is asserted, the pulse width modulator 106 switches the pulse signal $S_{2H}$ to the off level, thereby forcibly turning off the high-side transistor $M_H$. Similarly, when the overcurrent detection signal $S_{3L}$ is asserted, the pulse width modulator 106 switches the pulse signal $S_{2L}$ to the off level, thereby forcibly turning off the low-side transistor $M_L$.

Alternatively, the overcurrent detection signals $S_{3H}$ and $S_{3L}$ may be input to the driving circuits 104H and 104L, respectively. When the overcurrent detection signal $S_{3H}$ is asserted, the driving circuit 104H may switch the gate signal of the high-side transistor $M_H$ to the low level, thereby forcibly turning off the high-side transistor. Similarly, when the overcurrent detection signal $S_{3L}$ is asserted, the driving circuit 104L may switch the gate signal of the low-side transistor $M_L$ to the low level, thereby forcibly turning off the low-side transistor $M_L$.

More preferably, when a predetermined number of cycles, i.e., N cycles (N represents an integer of 2 or more), of assertions of the overcurrent detection signals $S_{3H}$ and $S_{3L}$ consecutively occur, the switching operation of the output stage 102 is suspended.

When the overcurrent detection signals $S_{3H}$ and $S_{3L}$ are asserted, a fail output circuit 108 changes the electric state of a fail pin FAIL. The FAIL pin is coupled to a processor 206 such as an external CPU or microcomputer. This allows the processor 206 to judge based on the state of the FAIL pin whether or not an abnormal state has occurred in the Class-D amplifier circuit 100. The fail output circuit 108 may include an output stage having an open-drain or otherwise open-collector configuration.

Figure 5A:
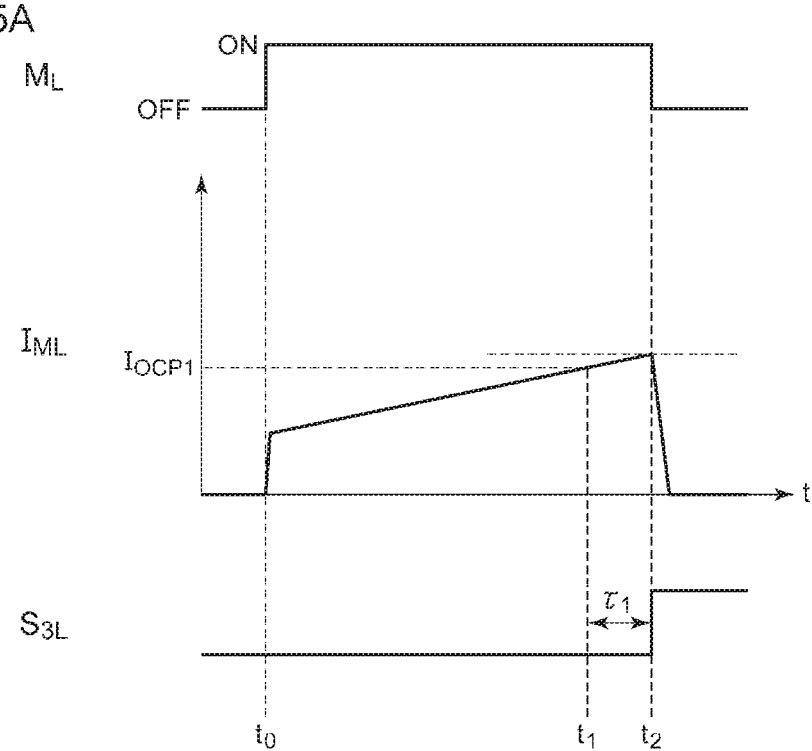
FIGS. 5A and 5B are waveform diagrams each showing the Class-D amplifier circuit shown in FIG. 4.
Figure 5B:
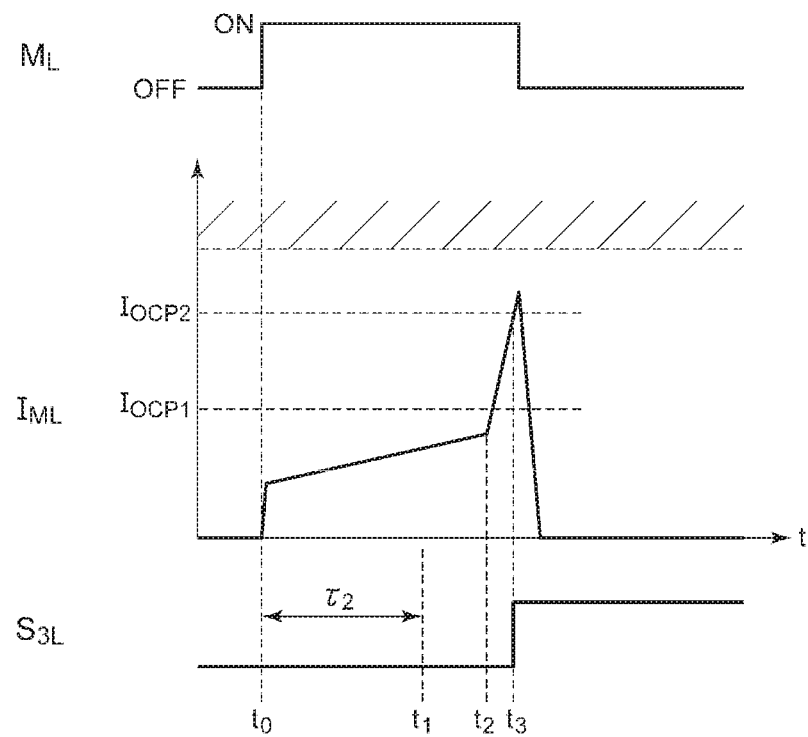

The above is the configuration of the Class-D amplifier circuit 100. Next, description will be made regarding the operation thereof. FIGS. 5A and 5B are operation waveform diagrams each showing the operation of the Class-D amplifier circuit 100 shown in FIG. 4. Description will be made below directing attention to the operation of the overcurrent detection circuit 130L.

First, description will be made with reference to FIG. 5A regarding the operation when no magnetic saturation occurs in the inductor L. After the low-side transistor $M_L$ is turned on at the time point $t_0$, the current $I_{ML}$ that flows through the low-side transistor $M_L$ starts to rise. When no magnetic saturation occurs, the slope of the rising of the current is small. In a case in which the current $I_{ML}$ reaches the first threshold value $I_{OCP1}$ at the time point $t_1$, the overcurrent detection signal $S_{3L}$ is asserted after the judgment time $\tau_1$ elapses in this state, i.e., at the time point $t_2$. This forcibly turns off the low-side transistor $M_L$, thereby blocking the current $I_{ML}$.

Next, description will be made with reference to FIG. 5B regarding the operation to be performed when magnetic saturation occurs in the inductor L. After the low-side transistor $M_L$ is turned on at the time point $t_0$, the current $I_{ML}$ that flows through the low-side transistor $M_L$ starts to rise. During a period up to the time point $t_1$ after the second period of time $\tau_2$ elapses from the turn-on of the low-side transistor $M_L$, the overcurrent detection based on the second condition is disabled.

In a case in which the DC current component that flows through the inductor L exceeds the allowable current $I_{DC\_MAX}$ at the time point $t_2$, the inductance falls, which raises the slope of rising of the current $I_{ML}$. When the current $I_{ML}$ exceeds the second threshold value $I_{OCP2}$ at the time point $t_3$, the overcurrent detection signal $S_{3L}$ is immediately asserted (after a delay that is shorter than the judgment time $\tau_1$). This forcibly turns off the low-side transistor $M_L$, which blocks the current $I_{ML}$.

It should be noted that the overcurrent detection circuit 130H operates in the same manner as that of the overcurrent detection circuit 130L, which can be understood by those skilled in this art. The above is the operation of the Class-D amplifier circuit 100. Next, description will be made regarding the advantage thereof.

With the Class-D amplifier circuit 100, as shown in FIG. 5A, in a case in which the DC current component that flows through the inductor L is smaller than the allowable current $I_{DC\_MAX}$, i.e., in a range in which no magnetic saturation occurs, such an arrangement is capable of detecting an overcurrent state based on the first threshold value $I_{OCP1}$ according to the first condition.

On the other hand, in a case in which the inductance value of the inductor L falls due to magnetic saturation as a result of the DC current component that flows through the inductor L exceeding the allowable current $I_{DC\_MAX}$, the current $I_{ML}$ that flows through the transistor $M_L$ reaches the second threshold value $I_{OCP2}$. In this case, by asserting the overcurrent detection signal $S_{3L}$ with a delay that is shorter than the first period of time (judgment time) $\tau_1$, such an arrangement is capable of detecting an overcurrent state before the current that flows through the transistor $M_L$ rises excessively. This allows suitable protection to be performed before the current $I_{ML}$ enters a damage region represented by the hatched area.

Here, immediately after the transistor $M_L$ of the output stage 102 is turned on, the effects of noise become greater. On the other hand, the DC current component that flows through the inductor L exceeds the allowable current $I_{DC\_MAX}$ after time elapses to a certain degree after the transistor $M_L$ of the output stage 102 is turned on. Accordingly, in many cases, the DC current component does not exceed the allowable current $I_{DC\_MAX}$ immediately after the transistor $M_L$ of the output stage 102 is turned on. Thus, by enabling the overcurrent detection based on the second threshold value $I_{OCP2}$ after a predetermined second period of time $\tau_2$ elapses after the transistor $M_L$ to be monitored is turned on, which is employed as a condition for the overcurrent detection based on the second threshold value $I_{OCP2}$, such an arrangement is capable of masking noise. This prevents false detection of the overcurrent state due to noise.

Figure 6:
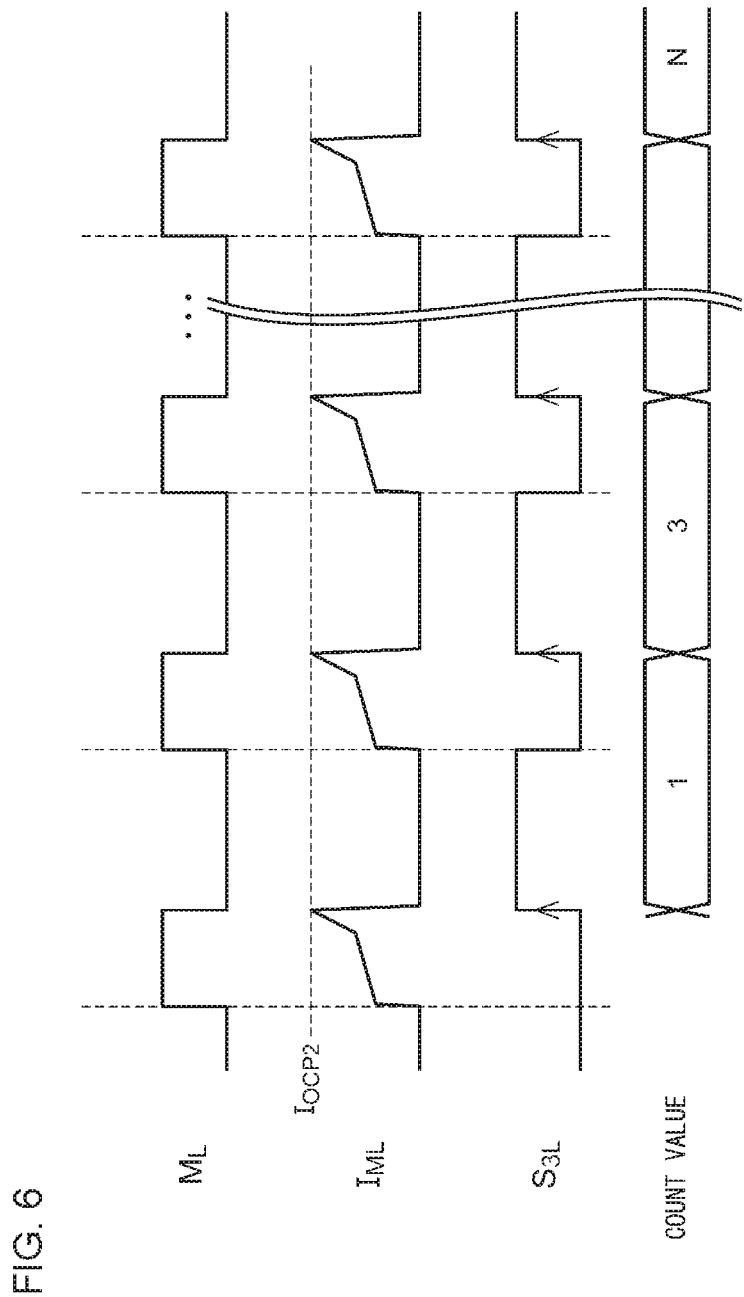
FIG. 6 is an operation waveform diagram showing the operation of the Class-D amplifier circuit when magnetic saturation continuously occurs.

FIG. 6 is an operation waveform diagram showing the operation of the Class-D amplifier circuit 100 when magnetic saturation continuously occurs. FIG. 6 shows the operation over multiple switching cycles, the number of which is greater than that shown in FIG. 5B. In a case in which magnetic saturation occurs, the current $IM_L$ that flows through the low-side transistor $M_L$ exceeds the second threshold value $I_{OCP2}$ for every switching cycle. A counter counts the number of times the overcurrent detection signal $S_{3L}$ is asserted. When the count value reaches a predetermined number N, the OUT pin is set to the high-impedance state (both the high-side transistor $M_H$ and the low-side transistor $M_L$ are turned off), which suspends the switching operation of the output stage 102. With such an arrangement, while removing the effects of noise, when magnetic saturation occurs, this allows the playback of an audio signal to be suspended.

The present invention encompasses various kinds of apparatuses and circuits that can be regarded as a circuit configuration shown in FIG. 4 or otherwise that can be derived from the aforementioned description. That is to say, the present invention is not restricted to a specific configuration. More specific description will be made below regarding an example configuration for clarification and ease of understanding of the essence of the present invention and the circuit operation. That is to say, the following description will by no means be intended to restrict the technical scope of the present invention.

Figure 7:
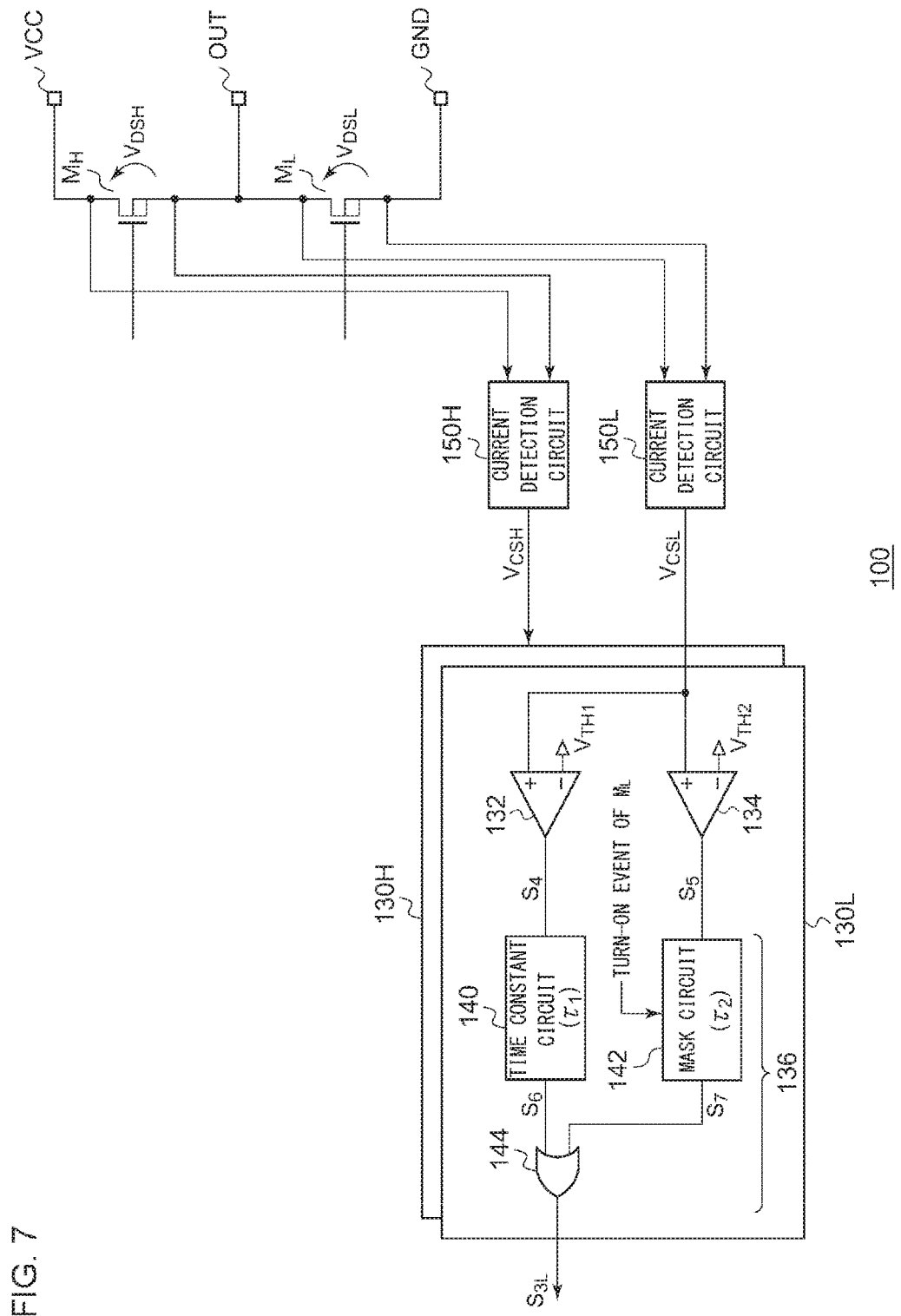
FIG. 7 is a circuit diagram showing a specific example configuration of the Class-D amplifier circuit.

FIG. 7 is a circuit diagram showing a specific example configuration of the Class-D amplifier circuit 100. Current detection circuits 150H and 150L generate current detection signals $V_{CSH}$ and $V_{CSL}$ that indicate the currents that flow through the high-side transistor $M_H$ and the low-side transistor $M_L$, respectively. The current detection signals $V_{CSH}$ and $V_{CSL}$ may correspond to voltage drops (i.e., drain-source voltages $V_{DS}$) of the high-side transistor $M_H$ and the low-side transistor $M_L$, respectively. In a case in which the on resistance $R_{ON}$ of the high-side transistor $M_H$ is a known value, the drain-source voltage $V_{DSH}$ is represented by the following Expression.

$$V_{DSH}=R_{ON} \times I_{MH}$$

The same can be said of the low-side transistor.

The current detection circuit 150H shifts the voltage drop $V_{DSH}$ across the high-side transistor $M_H$ to a voltage with the ground voltage as a reference voltage, and amplifies the voltage drop thus shifted with a suitable gain as appropriate. The voltage drop $V_{DSL}$ across the low-side transistor $M_L$ occurs with the ground voltage as a reference voltage. Accordingly, there is no need to shift the voltage drop $V_{DSL}$, and the current detection circuit 150L amplifies the voltage drop $V_{DSL}$ with a suitable gain as appropriate.

As described above, the overcurrent detection circuit 130L may be configured including the first comparator 132, the second comparator 134, and the judgment circuit 136. When the assertion of the first comparison signal $S_4$ continues for the judgment time $\tau_1$, a time constant circuit 140 of the judgment circuit 136 asserts (sets to the high level, for example) an output $S_6$ thereof. By combining the first comparator 132 and the time constant circuit 140, this provides overcurrent detection based on the first condition using the first threshold $I_{OCP1}$.

A signal that indicates a turn-on event of the low-side transistor $M_L$ (e.g., gate signal of the low-side transistor $M_L$ or the like) is input to a mask circuit 142 of the judgment circuit 136. The mask circuit 142 masks the change of the second comparison signal $S_5$ for the mask time $\tau_2$ from the turn-on event of the low-side transistor $M_L$. In a case in which the second comparison signal $S_5$ is asserted after the mask time $\tau_2$ elapses from the turn-on of the low-side transistor $M_L$, an output signal $S_7$ of the mask circuit 142 is asserted (set to the high level, for example). By combining the second comparator 134 and the mask circuit 142, such an arrangement provides overcurrent detection based on the second condition using the second threshold value $I_{OCP2}$.

When at least one from among the two signals $S_6$ and $S_7$ is asserted, a logic gate 144 asserts the overcurrent detection signal $S_{3L}$. For example, the logic gate 144 may be configured as an OR gate.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 8:
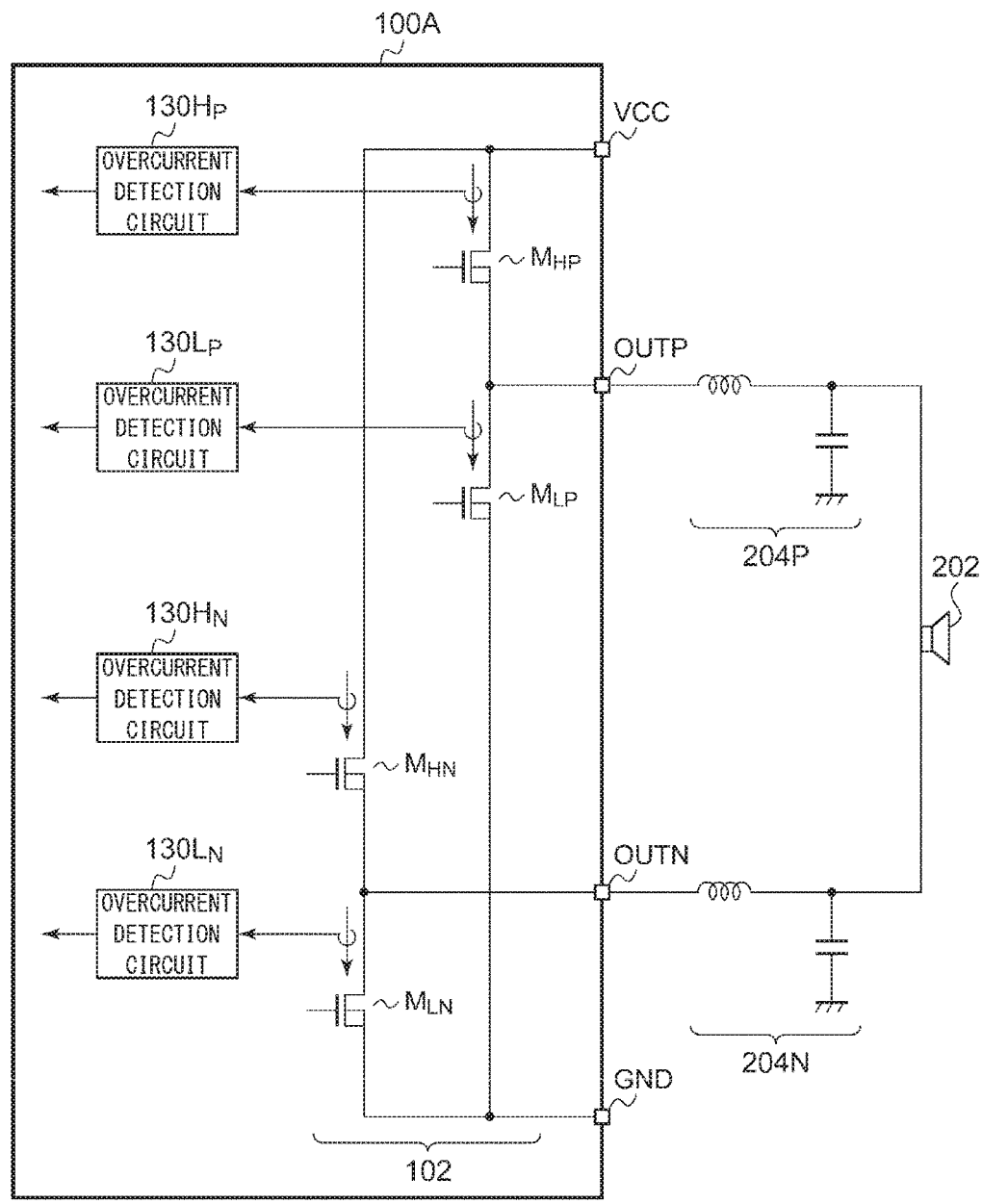
FIG. 8 is a block diagram showing a Class-D amplifier employing the BTL method.

The present invention is also applicable to a BTL (Bridged Transformerless) Class-D amplifier circuit 100A having a full-bridge output stage. FIG. 8 is a block diagram showing a BTL Class-D amplifier circuit 100A. An output stage 102A includes four transistors $M_{HP}$, $M_{LP}$, $M_{HN}$, and $M_{LN}$. Overcurrent detection circuits 130$H_P$, 130$L_P$, 130$H_N$, and 130$L_N$ are respectively configured to monitor the currents that flow through the four transistors $M_{HP}$, $M_{LP}$, $M_{HN}$, and $M_{LN}$. The other configurations are the same as those shown in FIG. 4. The operation method for such a BTL Class-D amplifier is not restricted in particular. Such an arrangement may employ a differential operation method in which the voltage $V_{OUTP}$ at an OUTP pin and the voltage $V_{OUTN}$ at an OUTN pin have a complementary relation Also, such a Class-D amplifier may be operated using a filterless method. Even in such a case of employing a filterless method, an inductor L is inserted in order to remove noise. Accordingly, such an arrangement also has the potential to have a problem of magnetic saturation in the inductor L. Thus, the present invention is effectively applicable.

[Second Modification]

The high-side transistor $M_H$ may be configured as a P-channel MOSFET.

[Third Modification]

The protection operation to be performed when an overcurrent state has been detected is not restricted in particular. For example, the overcurrent detection signals $S_{3H}$ and $S_{3L}$ may be supplied to an unshown higher-level controller or otherwise a CPU (Central Processing Unit) or microcomputer external to the Class-D amplifier circuit 100, instead of or in addition to the turn-off of a transistor at which an overcurrent state has been detected or suspension of the switching operation of the output stage. In this case, this allows such an external CPU or the like to execute an appropriate protection operation.

[Usage]

Figure 9A:
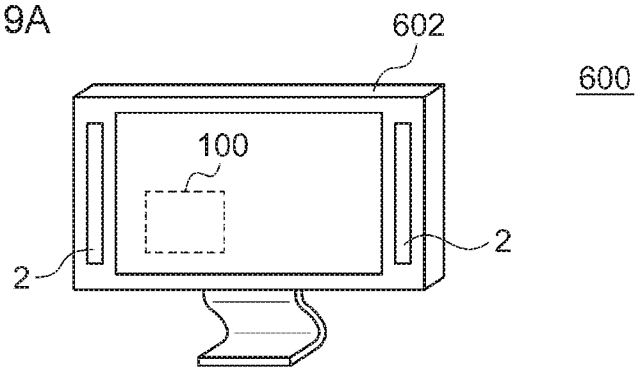
FIGS. 9A through 9C are external views each showing an electronic device.
Figure 9B:
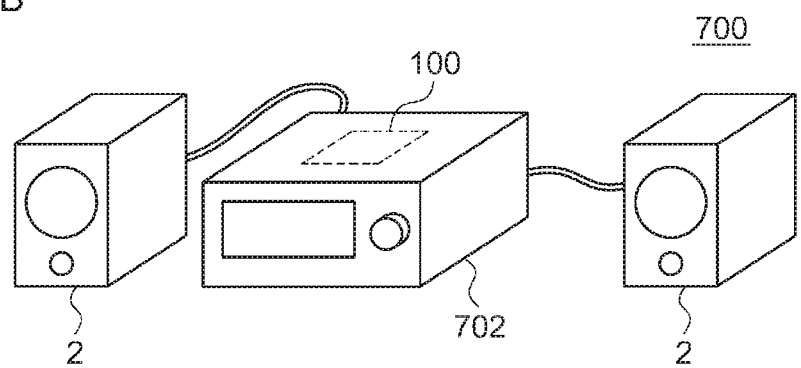
Figure 9C:
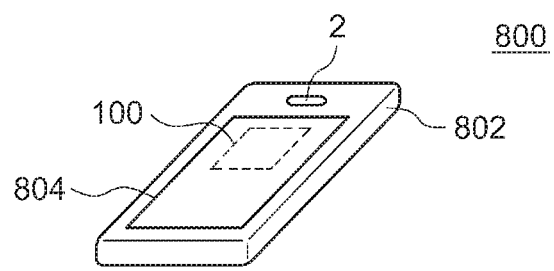

Lastly, description will be made regarding an application of the audio output device 200. FIGS. 9A through 9C are external views each showing an electronic device 1. FIG. 9A shows a display apparatus 600 which is an example of the electronic device 1. The display apparatus 600 includes a housing 602 and speakers 2. The audio output device 200 is built into the housing, and drives the speakers 2. The speakers 2 correspond to the electroacoustic conversion element 202.

FIG. 9B shows an audio component device 700 which is an example of the electronic device 1. The audio component device 700 includes a housing 702 and speakers 2. The audio output device 200 is built into the housing 702, and drives the speakers 2.

FIG. 9C shows a compact information terminal 800 which is an example of the electronic device 1. The compact information terminal 800 is configured as a cellular phone, PHS (Personal Handy-phone System), PDA (Personal Digital Assistant), tablet PC (Personal Computer), audio player, or the like. The compact information terminal 800 includes a housing 802, a speaker 2, and a display 804. The audio output device 200 is built into the housing 802, and drives the speaker 2.

While the preferred embodiments of the present invention have been described using specific terms, such description is for illustrative purposes only, and it is to be understood that changes and variations may be made without departing from the spirit or scope of the appended claims.

What is claimed is:

1. A Class-D amplifier circuit comprising:
    a bridge output stage coupled to an electroacoustic conversion element via an inductor;
    a driving circuit structured to drive the output stage according to a pulse signal that corresponds to an audio signal; and an overcurrent detection circuit structured to assert an overcurrent detection signal (i) when a current that flows through a transistor to be monitored that forms the output stage exceeds a first threshold value for a predetermined first period of time, or (ii) when a current that flows through the transistor to be monitored exceeds a second threshold value that is higher than the first threshold value after a predetermined second period of time elapses after the transistor to be monitored turns on, wherein the overcurrent detection circuit comprises:

a first comparator structured to compare a current detection signal that corresponds to a current that flows through the transistor to be monitored with a first threshold voltage that corresponds to the first threshold value, and to generate a first comparison signal indicating a comparison result;

a second comparator structured to compare the current detection signal with a second threshold voltage that corresponds to the second threshold value, and to generate a second comparison signal indicating a comparison result; and a judgment circuit structured to generate the overcurrent detection signal based on the first comparison signal and the second comparison signal.

2. The Class-D amplifier circuit according to claim 1, wherein the transistor to be monitored is turned off according to an assertion of the overcurrent detection signal.

3. The Class-D amplifier circuit according to claim 1, wherein, when a predetermined number of cycles of assertions of the overcurrent detection signal consecutively occur, switching of the output stage is suspended.

4. The Class-D amplifier circuit according to claim 1, further comprising a fail output circuit structured to output the overcurrent detection signal to an external circuit.

5. The Class-D amplifier circuit according to claim 1, wherein the current detection signal corresponds to a voltage drop across the transistor to be monitored.

6. The Class-D amplifier circuit according to claim 1, wherein a high-side transistor and a low-side transistor are both set to be the transistor to be monitored.

7. The Class-D amplifier circuit according to claim 1, wherein the output stage is configured as a full-bridge circuit.

8. The Class-D amplifier circuit according to claim 1, monolithically integrated on a single semiconductor substrate.

9. An audio output device comprising:
an electroacoustic conversion element;
the Class-D amplifier circuit according to claim 1; and
a filter circuit comprising an inductor arranged between the Class-D amplifier circuit and the electroacoustic conversion element.

10. An electronic device comprising:
an electroacoustic conversion element;
the Class-D amplifier circuit according to claim 1; and
a filter circuit comprising an inductor arranged between the Class-D amplifier circuit and the electroacoustic conversion element.

11. A control method for a Class-D amplifier circuit coupled to an electroacoustic conversion element via an inductor, the control method comprising:
generating a pulse signal that corresponds to an audio signal;
driving an output stage of the audio Class-D amplifier according to the pulse signal; and
generating an overcurrent detection signal which is asserted (i) when a current that flows through a transistor to be monitored that forms the output stage exceeds a first threshold value for a predetermined first period of time, or (ii) when a current that flows through the transistor to be monitored exceeds a second threshold value that is higher than the first threshold value after a predetermined second period of time elapses after the transistor to be monitored turns on, wherein generating the overcurrent detection signal comprises:
comparing a current detection signal that corresponds to a current that flows through the transistor to be monitored with a first threshold voltage that corresponds to the first threshold value so as to generate a first comparison signal indicating a comparison result;
comparing the current detection signal with a second threshold voltage that corresponds to the second threshold value so as to generate a second comparison signal indicating a comparison result; and
generating the overcurrent detection signal based on the first comparison signal and the second comparison signal.

12. The control method according to claim 11, further comprising suspending switching of the output stage when a predetermined number of cycles of assertions of the overcurrent detection signal consecutively occur.

* * * * *